United States Patent
Shang et al.

(10) Patent No.: US 10,321,577 B2
(45) Date of Patent: Jun. 11, 2019

(54) WAFER-LEVEL MANUFACTURING METHOD FOR EMBEDDING PASSIVE ELEMENT IN GLASS SUBSTRATE

(71) Applicant: Southeast University, Jiangsu (CN)

(72) Inventors: Jintang Shang, Jiangsu (CN); Mengying Ma, Jiangsu (CN)

(73) Assignee: Southeast University, Jiangsu (CN)

( * ) Notice: Subject to any disclaimer, the term of this patent is extended or adjusted under 35 U.S.C. 154(b) by 109 days.

(21) Appl. No.: 15/619,525

(22) Filed: Jun. 11, 2017

(65) Prior Publication Data

US 2017/0280566 A1    Sep. 28, 2017

Related U.S. Application Data

(63) Continuation-in-part of application No. PCT/CN2015/098677, filed on Dec. 24, 2015.

(30) Foreign Application Priority Data

Dec. 11, 2014   (CN) .......................... 2014 1 0765689

(51) Int. Cl.
*H01P 3/00* (2006.01)
*H05K 3/18* (2006.01)
(Continued)

(52) U.S. Cl.
CPC ............. *H05K 3/002* (2013.01); *H01L 21/38* (2013.01); *H01L 28/10* (2013.01); *H01L 28/20* (2013.01);
(Continued)

(58) Field of Classification Search
CPC ...... H05K 1/0306; H05K 1/162; H05K 1/165; H05K 3/002; H05K 3/0041; H05K 3/188; H05K 3/007
See application file for complete search history.

(56) References Cited

U.S. PATENT DOCUMENTS 5,624,870 A    4/1997   Chien et al.

FOREIGN PATENT DOCUMENTS

| CN | 103413780 | 11/2013 |
|----|-----------|---------|
| CN | 104401934 | 3/2015  |
| JP | 2002134659 | 5/2002 |

OTHER PUBLICATIONS

"International Search Report (Form PCT/ISA/210)", dated Mar. 31, 2016, with English translation thereof, pp. 1-4.

*Primary Examiner* — Livius R. Cazan
(74) *Attorney, Agent, or Firm* — JCIPRNET

(57) ABSTRACT

A wafer-level manufacturing method for embedding a passive element in a glass substrate is disclosed. A highly-doped silicon wafer is dry etched to form a highly-doped silicon mold wafer, containing highly-doped silicon passive component structures mold seated in cavity arrays; a glass wafer is anodically bonded to the highly-doped silicon mold wafer in vacuum pressure to seal the cavity arrays; the bonded wafers are heated so that the glass melts and fills gaps in the cavity arrays, annealing and cooling are performed, and a reflowed wafer is formed; the upper glass substrate of the reflowed wafer is grinded and polished to expose the highly-doped silicon passives; the passive component structure mold embedded in the glass substrate is fully etched; the blind holes formed in the glass substrates after the passive component structure mold has been etched is filled with copper by electroplating; the highly-doped silicon substrate and unetched silicon between the cavity arrays are etched, and several glass substrates embedded with a passive element are obtained; to form electrodes for the passives, a metal adhesion layer is deposited, and a metal conductive layer is electroplated. The process is simple, costs are low, and the prepared passive elements have superior performance.

19 Claims, 4 Drawing Sheets

(51) Int. Cl.
*H05K 1/03* (2006.01)
*H01L 21/38* (2006.01)
*H05K 3/00* (2006.01)
*H05K 3/10* (2006.01)
*H05K 3/30* (2006.01)
*H01L 49/02* (2006.01)
*H01P 5/02* (2006.01)
*H03H 1/00* (2006.01)
*H05K 1/16* (2006.01)

(52) U.S. Cl.
CPC ........... *H01L 28/40* (2013.01); *H05K 1/0306* (2013.01); *H05K 3/0029* (2013.01); *H05K 3/0041* (2013.01); *H05K 3/0055* (2013.01); *H05K 3/0094* (2013.01); *H05K 3/10* (2013.01); *H05K 3/188* (2013.01); *H05K 3/301* (2013.01); *H01P 3/003* (2013.01); *H01P 5/02* (2013.01); *H03H 2001/0021* (2013.01); *H05K 1/162* (2013.01); *H05K 1/165* (2013.01); *H05K 2203/1105* (2013.01)

WAFER-LEVEL MANUFACTURING METHOD FOR EMBEDDING PASSIVE ELEMENT IN GLASS SUBSTRATE

CROSS-REFERENCE TO RELATED APPLICATION

This is a continuation-in-part application of International Application No. PCT/CN2015/098677, filed on Dec. 24, 2015, which claims the priority benefits of China Application No. 201410765689.7, filed on Dec. 11, 2014. The entirety of each of the above-mentioned patent applications is hereby incorporated by reference herein and made a part of this specification.

BACKGROUND OF THE INVENTION

Field of the Invention

The present invention relates to packaging of microelectromechanical systems, and more particularly to a wafer-level manufacturing method for embedding a passive element in a glass substrate.

Description of Related Art

A manufacturing process of a single element in a traditional radio frequency (RF) microelectromechanical system uses a surface processing technology. An RF passive element prepared by the surface processing technology has a relatively short longitudinal extension, a relatively large direct current (DC) resistance, and a short electrical path, and is a 2D planar component. 3D interconnection is generally implemented by layer-to-layer stacking with adapter plates. Using the surface processing technology to prepare a 3D RF microelectromechanical system has disadvantages of a complicated process, high costs, a limited performance of components due to 2D planar characteristics, and the like.

Advanced 3D system packaging is implemented by using an embedded substrate. A novel 3D RF microelectromechanical system uses a silicon substrate embedded with a passive element (e.g. resistor, capacitor, inductor, and the like) to achieve 3D interconnection. This process is based on a process of making a via and then electroplating for a conductive through silicon via (TSV), and includes: first, a silicon substrate is dry etched to form a gap for embedding a RF passive element; second; then, a dielectric insulating layer is prepared by chemical deposition or silicon high-temperature oxidation; and finally, the gap in the silicon substrate is filled by chemical deposition of a seed layer and electroplating of a conductive metal, thereby preparing a passive element embedded in the silicon substrate. However, the silicon substrate has conductive properties, and the compactness and thickness of the dielectric barrier layer is subjected to nano-size constraints, resulting in a failure of electrical isolation of an embedded RF component in a high frequency. Although this process is simpler than the manner of forming the 3D RF microelectromechanical system by stacking, the process steps are still relatively complicated, and after the gap is formed by the dry-etching process, the seed layer needs to be deposited and then electroplating of the conductive via is performed. The compactness and uniformity of the seed layer in the via and the adhesion to the substrate directly determine a filling effect of the electroplated metal. Therefore, a fine processing technology is required to prepare an excellent seed layer. The process control is relatively complicated and expensive.

A traditional processing technology for embedding a component in a glass substrate is based on the processing technology for embedding a component in a silicon substrate. First, an inner cavity in a glass is formed by sandblasting, HF wet-etching, deep reactive ion etching (DRIE), laser drilling, or the like, and second, a component embedded in the glass and filled with a conductive metal is prepared using an electroplating process. However, a cavity made by the sandblasting is tapered and is of a rough side wall; the HF wet-etching process can hardly manufacture an inner cavity with a high depth-to-width ratio in a glass; the DRIE requires a complicated mask processing technology and involves a very slow etching speed; and the laser drilling may introduce residual stresses and defects into a glass. After the cavity is prepared, a uniform and compact seed layer needs to be deposited, and then the cavity is filled with a conductive metal through an electroplating process. The process control is relatively complicated and expensive.

SUMMARY OF THE INVENTION

Technical Problem

An objective of the present invention is to provide a novel wafer-level manufacturing method for embedding a passive element in a glass substrate, which is of simple process, low costs, and superior transmission performance, so as to solve the foregoing problems.

Technical Solution

The present invention adopts the following technical solution:

A wafer-level manufacturing method for embedding a passive element in a glass substrate, including the following steps:
  step 1: dry-etching a highly-doped silicon wafer to form a highly-doped silicon mould wafer, containing highly-doped silicon passive component structures mould seated in cavity arrays, unetched silicon between the cavity arrays being used for subsequent component separation;
  step 2: anodically-bonding a glass wafer to the highly-doped silicon mould wafer obtained in step 1 in a vacuum, so as to enable the cavity arrays to be sealed in bonded wafers;
  step 3: heating the bonded wafers obtained in step 2 in air at a temperature higher than the softening point temperature of the glass, maintaining the temperature until the molten glass is reflowed to fill gaps in the cavity arrays due to a pressure difference inside and outside the cavities, and annealing and cooling to room temperature to form a reflowed water with a three-layer structure including a lower all-highly-doped-silicon substrate, a middle composite structure of the glass substrate embedded with the passive component structure highly-doped silicon mould and the unetched silicon, and an upper all-glass substrate;
  step 4: fully grinding and polishing the all-glass substrate of the reflowed wafer obtained in step 3, so as to expose an upper surface of the embedded passive component structure mould on an upper surface of the glass substrate;
  step 5: dry-etching the passive component structure mould of highly-doped silicon embedded in the glass substrate;

step 6: using the all-highly-doped-silicon substrate as a seed layer, filling, via copper electroplating, the blind holes in the glass substrate after the passive component structure mould has been etched, thereby forming a passive element embedded in the glass substrate;

step 7: wet-etching the all-highly-doped-silicon substrate and the unetched silicon between the cavity arrays to obtain several cutting-free and self-separating glass substrates embedded with the passive element; and step 8: performing surface processing on each of the glass substrates obtained in step 7, by depositing a metal adhesion layer and electroplating a metal conductive layer to form electrodes for the passives.

Shapes of the embedded passive component structure mould in step 1 include cylinder, annular cylinder, and coaxial cylinder, or meander-shaped column, square spiral column, hexagonal spiral column, octagonal spiral column, and circular spiral column, or double cuboid, and coaxial dual-annular cylinder.

An impurity doped in the highly-doped silicon wafer in step 1 is phosphorus (P) or arsenic (As), the resistivity is 0.001 to 0.005 $\Omega \cdot cm$, and the thickness is 300 to 600 $\mu m$; and the dry-etching is DRIE, and the etching depth is less than the thickness of the highly-doped silicon wafer by 100 $\mu m$ or more.

The glass wafer in step 2 is borosilicate glass with the thickness of 300 to 500 $\mu m$, and the conditions of the anodic bonding process performed in the vacuum are that the temperature is 400° C., the voltage is 800 V, and the vacuum degree is less than $10^{-3}$ Pa.

The conditions of the heating process in step 3 are that the heating temperature is 820° C. to 1100° C., for example, the heating temperature is 900° C. to 1100° C., and the heating holding time is 20 minutes to 10 hours, for example, the heating holding time is 6 to 10 hours; the conditions of the annealing process are that the annealing temperature is 510° C. to 560° C., and the annealing holding time is 30 min; and the cooling to room temperature is natural cooling.

The grinding and polishing in step 4 is that: first, using an automatic grinding and polishing machine, the all-glass substrate is subjected to a grinding and thinning process until the all-glass substrate is substantially removed, and second, the surface of the glass is polished by using a cerium oxide polishing solution until the glass substrate is exposed, and at this time, the upper surface of the embedded passive component structure mould is exposed on the smooth upper surface of the glass substrate.

The dry-etching in step 5 is DRIE; the determination to stop the etching is that the passive component structure mould is exactly completely etched, or the passive component structure mould is completely etched and the lower all-highly-doped-silicon substrate is etched for not greater than 20 $\mu m$.

The conditions of the copper electroplating process in step 6 are that: in an acidic sulfate plating solution for the copper electroplating, the content of $CuSO_4 \cdot 5H_2O$ is 85 g/L, the content of $H_2SO_4$ is 200 g/L, the content of is 79 mg/L, and the current density is 30 $mA/cm^2$.

The conditions of the wet-etching process in step 7 are that an etching solution is a 40 wt % potassium hydroxide solution, and the etching temperature is 70° C.

In step 8, the deposited metal adhesion layer is Ti or Cr, and the electroplated metal conductive layer is Au or Cu.

Advantageous Effect

The present invention has the following advantageous effects.

1. In the present invention, first, a dry-etching process is used to etch a highly-doped silicon wafer to form a passive component structure mould, the etched structure is of high verticality and low roughness, and the process is one in which planar size and thickness dimension of the etched structure are highly designable, such that the design of an embedded passive single element has more possibilities. The dry-etching process can manufacture a cylinder, an annular cylinder, coaxial cylinder, and the like, so as to prepare a cylinder-shaped conductive via, an annular-cylinder-shaped conductive via, and a coaxial-cylinder-shaped via that are embedded in a glass substrate; can manufacture a meander-shaped column, a square spiral column, a hexagonal spiral column, an octagonal spiral column, a circular spiral column, and the like, so as to prepare inductors embedded in a glass substrate; and can manufacture a double cuboid and a coaxial dual-annular cylinder, so as to prepare capacitors embedded in a glass substrate.

2. In the present invention, the dry-etching process is used to form a highly-doped silicon mould wafer, containing cavity arrays embedded in the passive component structure mould, the cavity arrays are filled with glass to form glass substrates, silicon between the cavity arrays separates the glass substrates from each other, and the glass substrates are released and separated by means of a silicon etching process without an additional cutting process.

3. In the present invention, the highly-doped silicon wafer is used as a manufacturing mould for embedding a passive element in a glass substrate, and a silicon-based semiconductor process is mature, so that the made mould is of high precision; the highly-doped silicon wafer is anodically bonded to a glass wafer, the highly-doped silicon wafer serves as a protective carrier sheet for the glass wafer when the glass wafer is ground and polished, and there is no need to additionally use a bonding process to manufacture a new carrier sheet-abrasive sheet composite structure; the highly-doped silicon wafer can be reused as a seed layer for subsequent copper electroplating, it is possible not to additionally deposit an adhesion layer and a seed layer for ensuring the performance of the copper electroplating process, and the highly-doped silicon wafer has advantages of using one wafer for three functions, reducing process steps, reducing costs, and the like. To enhance the reliability of the glass embedded copper vias, it is also possible to deposit adhesion layer, barrier layer, wetting layer and etc. as the traditional electroplating process.

4. In the present invention, an insulating glass substrate is used to replace a conductive silicon substrate; as compared with silicon, the glass has a lower thermal expansion coefficient and better thermal stability; glass is a good dielectric material, and there is no need to additionally prepare a dielectric insulating layer; biocompatibility and chemical stability of the glass enable a glass-based RF microelectromechanical system to be implanted in an organism for RF monitoring and RF transmission; and transparency of the glass also provides beneficial conditions for monitoring internal devices and interconnection reliability. Borosilicate glass is used as the glass substrate to be embedded with a passive element, for example, glass with model Pyrex7740 of Corning company, US, of which a thermal expansion coefficient is low and thatches with a thermal expansion coefficient of silicon, thereby providing high vacuum and low stress sealing of a microcavity when anodic bonding of the glass wafer and the silicon wafer is carried out.

5. In the present invention, the anodic bonding process is used to hermetically bond the highly-doped conductive silicon wafer and the glass wafer, a Si—O bond is formed in the bonding area, and at a high temperature, the chemical bond can still maintain high bonding strength, so that a situation that molten glass cannot fill cavitys, caused by equal pressures inside and outside the cavitys of the silicon wafer due to gas leakage in a high-temperature reflowed process, hardly occurs. The anodic bonding achieves a better sealing effect at the temperature of 400° C. and the voltage of 800 V.

6. In the present invention, the high-temperature reflowed process is used to form the glass substrate embedded with the passive component structure mould, the applied high temperature is 900° C.-1100° C., the holding time is 20 minutes to 10 hours, for example, the holding time is 6 to 10 hours, the process steps are simple, the applied temperature ensures that the glass and the highly-doped silicon material do not suffer from temperature-induced material modification or mutual infiltration, reaction, or other consequences, the thermal expansion coefficient of the glass matches with that of the highly-doped silicon material, thereby preventing an excessively large internal stress from being generated, and thus avoiding the defect of the structure, and the high-temperature reflowed process can manufacture a glass substrate embedded with a RF component structure mould in a non-porous coating manner. A semiconductor process of using a glass reflowed process to replace the traditional dry-etching method to obtain a structural gap, then depositing an adhesion layer, a barrier layer, and a seed layer, and further electroplating a metal conductive structure to manufacture an embedded component reduces the production time and costs and obtains a highly compact embedded passive element coated, in a non-porous manner, by a glass substrate.

7. In the present invention, the annealing process is used to eliminate an inner stress formed in the glass reflowed process, so as to increase structural strength. The annealing temperature is 510° C.-560° C., the holding time is 30 min, and then slow and natural cooling to room temperature is carried out; and the treatment at this temperature not only effectively eliminates a residual stress in the structure, but also ensures that the shape of the structure is unchanged.

8. In the present invention, the grinding process is used to remove an upper all-glass substrate, and then a cerium oxide polishing solution is used to polish a surface of the glass, so as to expose a middle portion formed by a composite structure of the glass substrate embedded with the passive component structure mould and unetched silicon, and in polishing, a micro-embossed portion, as compared with a recessed portion, of the surface of the glass is preferentially dissolved in the cerium oxide polishing solution, so as to obtain a bright and smooth glass surface with low surface roughness.

9. In the present invention, a grinding and polishing process is used to expose an upper surface of the embedded passive component structure mould on the surface of the glass, an exposed area is an etching window for subsequent etching of the embedded passive component structure mould, the bonded glass is of strong chemical stability, large thickness, and good compactness, thereby effectively protecting the silicon at the bottom from being corroded, and there is no need to additionally carry out etching mask deposition and windowing processes.

10. In the present invention, the dry-etching process is used to remove the passive component structure mould embedded in the glass substrate, and the process is of good anisotropy and high selectivity, and is contaminant-free, highly clean and mature.

11. In the present invention, an electroplating process using a remaining silicon substrate as a seed layer is used to prepare a copper-made passive element embedded in the glass substrate, the silicon substrate is a seed layer with high flatness, good compactness, and excellent structure, the copper electroplating provides a high filling rate and good compactness, and there is no need to additionally manufacture a seed layer, thereby reducing process steps and costs.

12. In the present invention, a silicon wet-etching process is used to remove the connecting silicon between the residual silicon substrate and the glass substrate, so as to obtain cutting-free and self-separating glass substrates embedded with the copper passive element, the process is of simple steps and high selectivity, and is suitable for batch production without the need of an additional cutting process.

13. In the present invention, the surface of the glass substrate is processed by first depositing a metal adhesion layer and then electroplating a metal conductive layer, so as to prepare an embedded passive element single element, or prepare a glass adapter plate embedded with a passive element that is applied to 3D system packaging, and the metal adhesion layer enhances the adhesion between the conductive metal and the glass substrate, and has an anti-stripping effect.

14. The passive element embedded in the glass substrate prepared in the present invention has a 3D structure, and the embedded element shortens the length of interconnection lines, saves the space of the surface of the substrate for integrating more system elements, and has, as compared with 3D system packaging using surface assembly and layer-to-layer stacking, advantages of simple preparation process, low costs, more compact packaging, and the like.

DETAILED DESCRIPTION OF THE INVENTION

The present invention is further explained below with reference to embodiments and accompanying drawings. The following embodiments are merely intended to describe the present invention, but are not intended to limit the implementation scope of the present invention.

Embodiment 1

Figure 1:
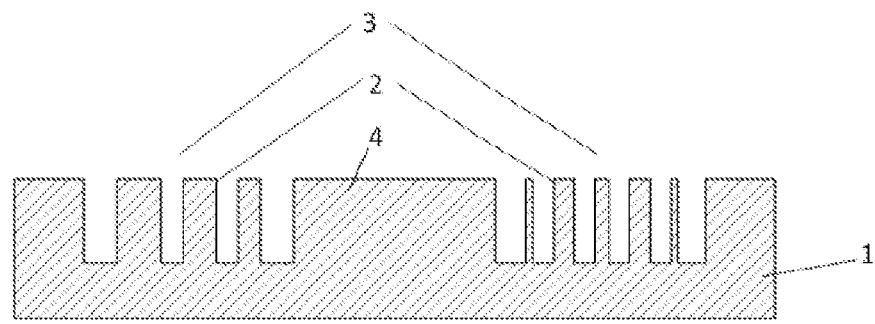
FIG. 1 is a sectional view of a highly-doped silicon mould wafer containing cavity arrays embedded in a passive component structure mould.
Figure 2:
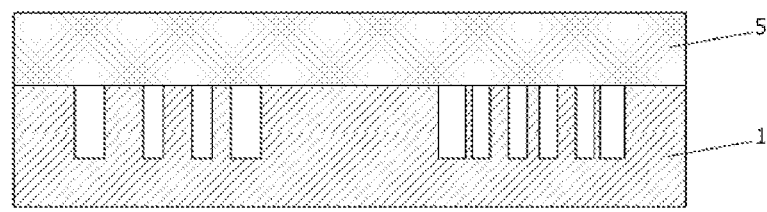
FIG. 2 is a sectional view of a bonded wafer obtained after a glass wafer is anodically bonded to the highly-doped silicon mould wafer.
Figure 3:
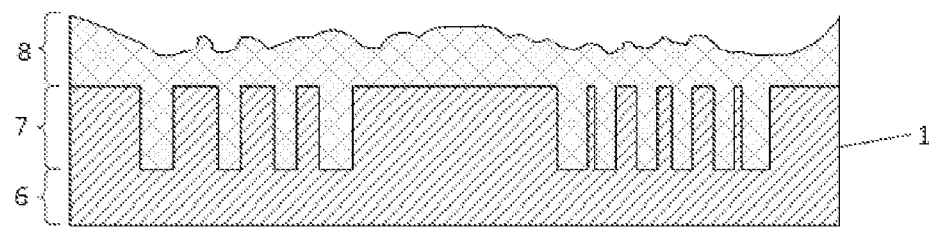
FIG. 3 is a sectional view of a reflowed wafer obtained after heating, refloweding, and annealing are carried out.
Figure 4:
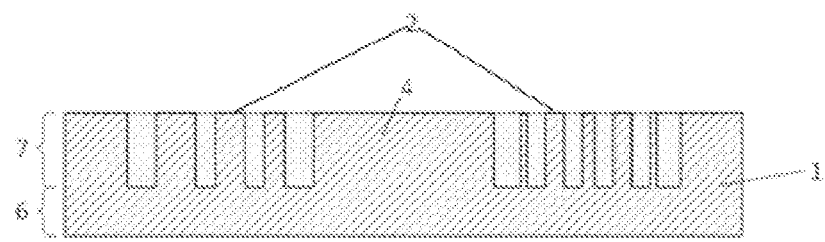
FIG. 4 is a sectional view of the reflowed wafer after being ground and polished.
Figure 5:
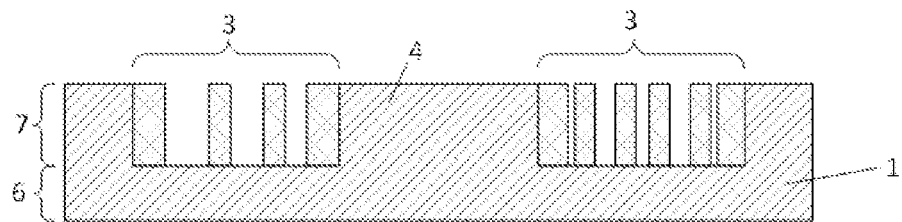
FIG. 5 is a sectional view of the reflowed wafer after the passive component structure mould is dry etched.
Figure 6:
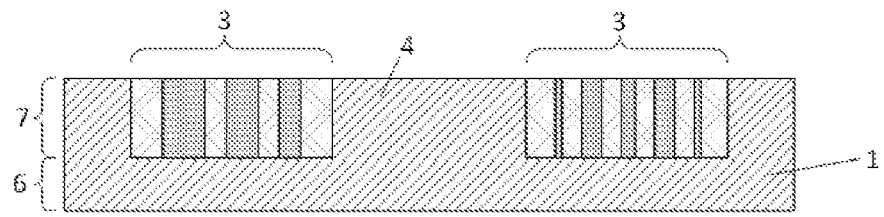
FIG. 6 is a sectional view of the reflowed wafer embedded with a copper-made passive element.
Figure 7:
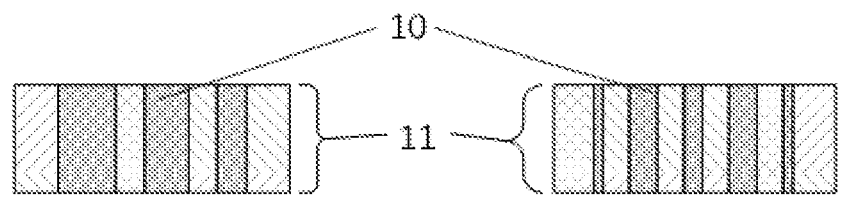
FIG. 7 is a sectional view of self-separated glass substrates embedded with a passive element after silicon is wet etched.
Figure 8:
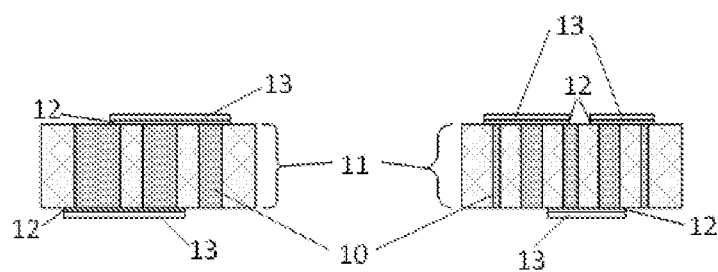
FIG. 8 is a sectional view of the glass substrates undergoing a surface processing procedure.
Figure 9:
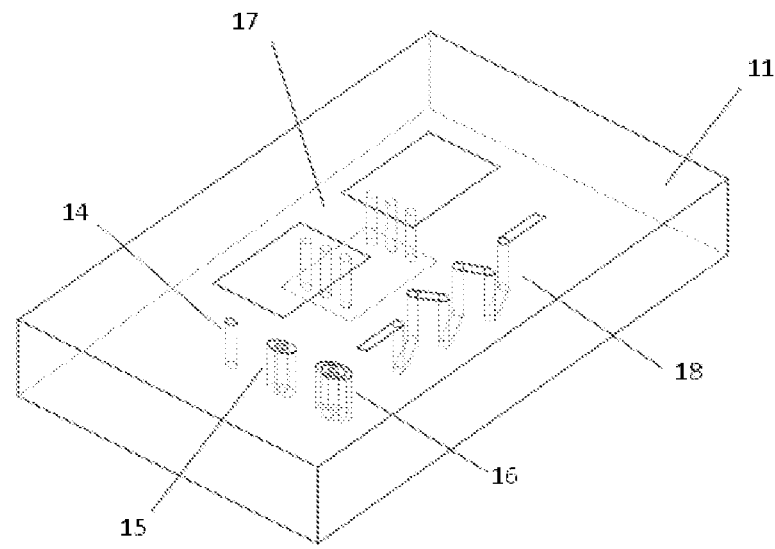
FIG. 9 is a perspective view of a glass substrate embedded with conductive vias, a meander-shaped inductor, and a coplanar waveguide.

A wafer-level manufacturing method for embedding a passive element in a glass substrate, including the following steps:

step 1: dry-etching a highly-doped silicon wafer to form a highly-doped silicon mould wafer 1, containing highly-doped silicon passive component structures mould 2 seated in cavity arrays 3, as shown in FIG. 1, unetched silicon 4 between the cavity arrays 3 being used for subsequent component separation. An impurity doped in the highly-doped silicon wafer is phosphorus (P), the resistivity is 0.001Ω·cm, and the thickness is 500 μm. The dry-etching is DRIE, and the etching depth is 200 μm. Shapes of the embedded passive component structure mould 2 include cylinder, annular cylinder, coaxial cylinder, a cylinder array of 3 rows×2 columns for coplanar waveguide interconnection, and a 6-cylinder array for manufacturing an embedded meander-shaped inductor.

step 2: anodically-bonding a glass wafer 5 to the highly-doped silicon mould wafer 1 obtained in step 1 under conditions that the vacuum pressure is less than $10^{-3}$ Pa, the temperature is 400° C., and the voltage is 800 V, so as to enable the cavity arrays 3 to be sealed in bonded wafers, as shown in FIG. 2. The glass wafer 5 is a glass with model Pyrex7740, and with a thickness of 300 μm.

step 3: heating the bonded wafers obtained in step 2 in air at a temperature of 900° C., maintaining the temperature for 6 h until the molten glass is reflowed to fill gaps in the cavity arrays 3 due to a pressure difference inside and outside the cavities, and annealing for 30 min at 560° C., and naturally cooling to room temperature to form a reflowed wafer with a three-layer structure including a lower all-highly-doped-silicon substrate 6, a middle composite structure 7 of the glass substrate embedded with the passive component structure mould 2 and the unetched silicon 4, and an upper all-glass substrate 8, as shown in FIG. 3.

step 4: first, using an automatic grinding and polishing machine, carrying out a grinding and thinning process on the all-glass substrate 8 until the all-glass substrate 8 is substantially removed, and second, using a cerium oxide polishing solution, polishing the surface of the glass until an upper surface of the embedded passive component structure mould 2 is exposed on an smooth upper surface of the glass substrate, as shown in FIG. 4.

step 5: carrying out DRIE on the passive component structure mould 2 embedded in the glass substrate, as shown in FIG. 5. The etching depth is 200 μm.

step 6: using the all-highly-doped-silicon substrate 6 as a seed layer, filling, via copper electroplating, blind holes in the glass substrate after the passive component structure mould 2 has been etched, thereby forming a passive element 10 embedded in the glass substrate, as shown in FIG. 6. The conditions of the copper electroplating process are that: in an acidic sulfate plating solution for the copper electroplating, the content of $CuSO_4 \cdot 5H_2O$ is 85 g/L, the content of $H_2SO_4$ is 200 g/L, the content of $Cl^-$ is 79 mg/L, and the current density is 30 $mA/cm^2$. To enhance the reliability of the glass embedded copper vias, it is also possible to deposit adhesion layer, barrier layer, wetting layer and some other functional layers as the traditional electroplating process.

step 7: wet-etching the all-highly-doped-silicon substrate 6 and the unetched silicon 4 between the cavity arrays 3 to obtain several cutting-free and self-separating glass substrates 11 embedded with the passive element 10, as shown in FIG. 7. The conditions of the wet-etching process are that an etching solution is a 40 wt % potassium hydroxide solution, and the etching temperature is 70° C.

step 8: performing surface processing on the glass substrates 11 obtained in step 7 to form electrodes for passive structures, by depositing a metal adhesion layer 12 Ti or Cr and electroplating a metal conductive layer 13 Au or Cu, as shown in FIG. 8, for use as a passive element single element or a 3D integrated glass adapter plate. The cylinder shape, annular cylinder shape, and coaxial-cylinder shape of the embedded passive component structure mould 2 are used to prepare a cylinder shaped conductive via 14, an annular cylinder shaped conductive via 15, and a coaxial-cylinder shaped conductive via 16 that are embedded in the glass substrate and applied to 3D component interconnection, for example, interconnection of a coplanar waveguide 17, or used to prepare a meander-shaped inductor 18 half-embedded in the glass substrate, as shown in FIG. 9. With regard to the copper cylinder array of 3 rows×2 columns, waveguide lines are prepared to connect lower surfaces of the cylinders, and two waveguide lines are prepared to respectively connect upper surfaces of each column of cylinders, so as to form a copper-cylinder-interconnected coplanar waveguide 17 structure. The preparation for the waveguide lines includes: depositing a metal adhesion layer 12 Ti or Cr, and electroplating a metal conductive layer 13 Au. With regard to the 6-cylinder array, wires are prepared to cover an upper surface of the first cylinder, five wires are prepared to respectively connect lower surfaces of the first cylinder and the second cylinder, upper surfaces of the second cylinder and the third cylinder, lower surfaces of the third cylinder and the fourth cylinder, upper surfaces of the fourth cylinder and the fifth cylinder, and lower surfaces of the fifth cylinder and the sixth cylinder; and a wire is prepared to cover an upper surface of the sixth cylinder, so as to form the meander-shaped inductor 18; the preparation for the wires includes: depositing a metal adhesion layer 12 Ti or Cr, and electroplating a metal conductive layer 13 Cu. Different types of coplanar waveguides and meander-shaped inductors can be formed through adding copper cylinders and preparing different shapes of wires.

Embodiment 2

Step 1: dry-etching a highly-doped silicon wafer to form a highly-doped silicon mould wafer 1, containing highly-doped silicon passive component structures mould 2 seated in cavity arrays 3, as shown in FIG. 1, unetched silicon 4 between the cavity arrays 3 being used for subsequent component separation. An impurity doped in the highly-doped silicon wafer is arsenic (As), the resistivity is 0.003Ω·cm, and the thickness is 600 μm. The dry-etching is DRIE, and the etching depth is 300 μm. Shapes of the embedded passive component structure mould 2 include meander-shaped column, square spiral column, hexagonal spiral column, octagonal spiral column, and circular spiral column, or double cuboid, and coaxial dual-annular cylinder.

Step 2: anodically-bonding a glass wafer 5 to the highly-doped silicon mould wafer 1 obtained in step 1 under conditions that the vacuum degree is less than $10^{-3}$ Pa, the temperature is 400° C., and the voltage is 800 V, so as to enable the cavity arrays 3 to be sealed in bonded wafers, as shown in FIG. 2. The glass wafer 5 is a glass with model Pyrex7740, and with a thickness of 500 μm.

Step 3: heating the bonded wafers obtained in step 2 in air at a temperature of 1000° C., maintaining the temperature for 6 h until the molten glass is reflowed to fill gaps in the cavity arrays 3 due to a pressure difference inside and outside the cavities, and annealing for 30 min at 560° C., and naturally cooling to room temperature to form a reflowed wafer with a three-layer structure including a lower all-highly-doped-silicon substrate 6, a middle composite structure 7 of the glass substrate embedded with the passive component structure mould 2 and the unetched silicon 4, and an upper all-glass substrate 8, as shown in FIG. 3.

Step 4: first, using an automatic grinding and polishing machine, carrying out a grinding and thinning process on the all-glass substrate 8 until the all-glass substrate 8 is substantially removed, and second, using a cerium oxide polishing solution, polishing the surface of the glass until an upper surface of the embedded passive component structure mould 2 is exposed on an smooth upper surface of the glass substrate, as shown in FIG. 4.

Step 5: carrying out DRIE on the passive component structure mould of highly-doped silicon 2 embedded in the glass substrate, as shown in FIG. 5. The etching depth is 300 μm.

Step 6: using the all-highly-doped-silicon substrate 6 as a seed layer, filling, via copper electroplating, blind holes in the glass substrate after the passive component structure mould 2 has been etched, thereby forming a passive element 10 embedded in the glass substrate, as shown in FIG. 6. The conditions of the copper electroplating process are that: in an acidic sulfate plating solution for the copper electroplating, the content of $CuSO_4 \cdot 5H_2O$ is 85 g/L, the content of $H_2SO_4$ is 200 g/L, the content of $Cl^-$ is 79 mg/L, and the current density is 30 mA/cm².

Step 7: wet-etching the all-highly-doped-silicon substrate 6 and the unetched silicon 4 between the cavity arrays 3 to obtain several cutting-free and self-separating glass substrates 11 embedded with the passive element 10, as shown in FIG. 7. The conditions of the wet-etching process are that an etching solution is a 40 wt % potassium hydroxide solution, and the etching temperature is 70° C.

Figure 10:
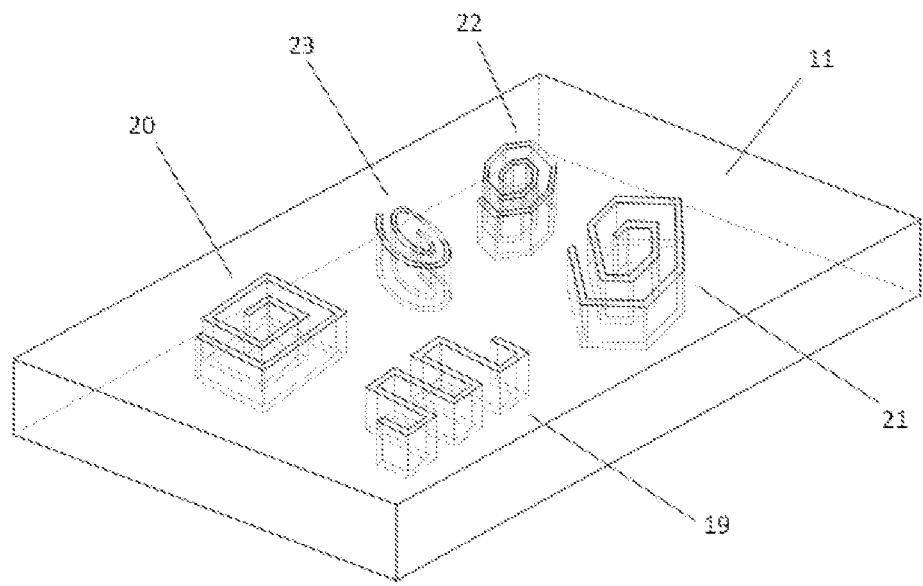
FIG. 10 is a perspective view of a glass substrate embedded with spiral inductors.
Figure 11:
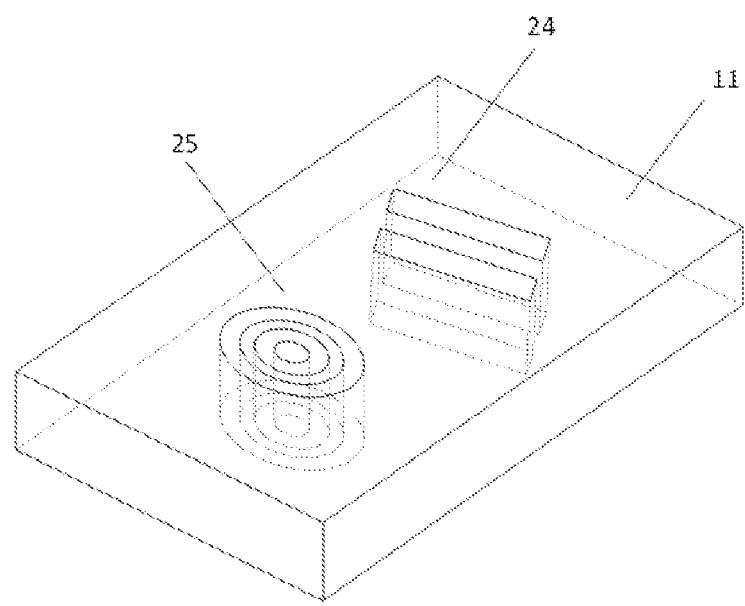
FIG. 11 is a perspective view of a glass substrate embedded with a capacitor.

Step 8: performing surface processing on each of the glass substrates 11 obtained in step 7 to form electrodes for the passives, by depositing a metal adhesion layer 12 Ti or Cr and electroplating a metal conductive layer 13 Au, as shown in FIG. 8, for use as a passive element single element or a 3D integrated glass adapter plate, as shown in FIG. 11. The meander-shaped column, square spiral column, hexagonal spiral column, octagonal spiral column, and circular spiral column are used to prepare a meander-shaped spiral inductor 19, a square spiral inductor 20, a hexagonal spiral inductor 21, an octagonal spiral inductor 22, and a circular spiral inductor 23 that are fully embedded in the glass substrate, as shown in FIG. 10. The double cuboid is used to prepare a plate-shaped capacitor 24 that is fully embedded in the glass substrate, and the coaxial dual-annular cylinder is used to prepare an annular capacitor 25 that is fully embedded in the glass substrate. The inductors and the capacitors can be interconnected through metals on the surfaces, so as to form elements such as a filter and an amplifier.

What is claimed is:
1. A wafer-level manufacturing method for embedding passive elements in a glass substrate, comprising the following steps:
   step 1: dry-etching a highly-doped silicon wafer to form a highly-doped silicon mould wafer, containing a passive component structure mould seated in cavity arrays, unetched silicon between the cavity arrays being used for subsequent component separation;
   step 2: anodically-bonding a glass wafer to the highly-doped silicon mould wafer obtained in step 1 in a vacuum, to seal the cavity arrays in the bonded glass wafer and highly-doped silicon mould wafer;
   step 3: heating the bonded glass wafer and highly-doped silicon mould wafer obtained in step 2 in air at a temperature higher than a softening point temperature of the glass wafer to melt the glass wafer, maintaining the temperature until the molten glass is reflowed to fill gaps in the cavity arrays due to a pressure difference inside and outside the cavities, and annealing and cooling to room temperature to form a reflowed wafer with a three-layer structure including a lower all-highly-doped-silicon substrate, a middle composite structure of the glass substrate embedded with the passive component structure mould and the unetched silicon, and an upper all-glass substrate;
   step 4: fully grinding and polishing the all-glass substrate of the reflowed wafer obtained in step 3, so as to expose an upper surface of the embedded passive component structure mould on an upper surface of the glass substrate;
   step 5: dry etching the passive component structure mould embedded in the glass substrate;
   step 6: using the all-highly-doped-silicon substrate as a seed layer, filling, via copper electroplating, blind holes in the glass substrate after the passive component structure mould has been etched, thereby forming the passive elements embedded in the glass substrate;
   step 7: wet-etching the all-highly-doped-silicon substrate and the unetched silicon between the cavity arrays to obtain several self-separating glass substrates embedded with the passive elements; and step 8: performing surface processing on the glass substrates obtained in step 7 to form electrodes for the passive elements, by depositing a metal adhesion layer and electroplating a metal conductive layer.

2. The wafer-level manufacturing method for embedding the passive elements in the glass substrate according to claim 1, wherein shapes of the embedded passive component structure mould in step 1 comprise cylinder, annular cylinder, and coaxial cylinder, or meander-shaped column, square spiral column, hexagonal spiral column, octagonal spiral column, and circular spiral column, or double cuboid.

3. The wafer-level manufacturing method for embedding the passive elements in the glass substrate according to claim 2, wherein an impurity doped in the highly-doped silicon wafer in step 1 is phosphorus (P) or arsenic (As), the resistivity is 0.001 to 0.005Ω·cm, and the thickness is 300 to 600 μm; and the dry-etching is DRIE, and the etching depth is less than the thickness of the highly-doped silicon wafer by 100 μm or more.

4. The wafer-level manufacturing method for embedding the passive elements in the glass substrate according to claim 2, wherein the glass wafer in step 2 is borosilicate glass with the thickness of 300 to 500 μm, and the conditions of the anodic bonding process performed in the vacuum are that the temperature is 400° C., the voltage is 800 V, and the vacuum degree is less than $10^{-3}$ Pa.

5. The wafer-level manufacturing method for embedding the passive elements in the glass substrate according to claim 2, wherein the conditions of the heating process in step 3 are that the heating temperature is 900° C. to 1100° C., and the heating holding time is 6 to 10 h; the conditions of the annealing process are that the annealing temperature is 510° C. to 560° C., and the annealing holding time is 30 min; and the cooling to room temperature is natural cooling.

6. The wafer-level manufacturing method for embedding the passive elements in the glass substrate according to claim 2, wherein the grinding and polishing in step 4 is that: first, by an automatic grinding and polishing machine, the all-glass substrate is subjected to a grinding and thinning process until the all-glass substrate is substantially removed, and second, the surface of the glass is polished by using a cerium oxide polishing solution until the glass substrate is exposed, and at this time, the upper surface of the embedded passive component structure mould is exposed on an upper surface of the glass substrate.

7. The wafer-level manufacturing method for embedding the passive elements in the glass substrate according to claim 2, wherein the dry-etching in step 5 is DRIE; the determination to stop the etching is that the passive component structure mould is exactly completely etched, or the passive component structure mould is completely etched and the lower all-highly-doped-silicon substrate is etched for not greater than 20 μm.

8. The wafer-level manufacturing method for embedding the passive elements in the glass substrate according to claim 2, wherein the conditions of the copper electroplating process in step 6 are that: in an acidic sulfate plating solution for the copper electroplating, the content of $CuSO_4 \cdot 5H_2O$ is 85 g/L, the content of $H_2SO_4$ is 200 g/L, the content of $Cl^-$ is 79 mg/L, and the current density is 30 $mA/cm^2$.

9. The wafer-level manufacturing method for embedding the passive elements in the glass substrate according to claim 2, wherein the conditions of the wet-etching process in step 7 are that an etching solution is a 40 wt % potassium hydroxide solution, and the etching temperature is 70° C.

10. The wafer-level manufacturing method for embedding the passive elements in the glass substrate according to claim 2, wherein in step 8, the deposited metal adhesion layer is Ti or Cr, and the electroplated metal conductive layer is Au or Cu.

11. The wafer-level manufacturing method for embedding the passive elements in the glass substrate according to claim 2, wherein the coaxial cylinder is a coaxial dual-annular cylinder.

12. The wafer-level manufacturing method for embedding the passive elements in the glass substrate according to claim 1, wherein an impurity doped in the highly-doped silicon wafer in step 1 is phosphorus (P) or arsenic (As), the resistivity is 0.001 to 0.005Ω·cm, and the thickness is 300 to 600 μm; and the dry-etching is DRIE, and the etching depth is less than the thickness of the highly-doped silicon wafer by 100 μm or more.

13. The wafer-level manufacturing method for embedding the passive elements in the glass substrate according to claim 1, wherein the glass wafer in step 2 is borosilicate glass with the thickness of 300 to 500 μm, and the conditions of the anodic bonding process performed in the vacuum are that the temperature is 400° C., the voltage is 800 V, and the vacuum degree is less than $10^{-3}$ Pa.

14. The wafer-level manufacturing method for embedding the passive elements in the glass substrate according to claim 1, wherein the conditions of the heating process in step 3 are that the heating temperature is 900° C. to 1100° C., and the heating holding time is 6 to 10 h; the conditions of the annealing process are that the annealing temperature is 510° C. to 560° C., and the annealing holding time is 30 min; and the cooling to room temperature is natural cooling.

15. The wafer-level manufacturing method for embedding the passive elements in the glass substrate according to claim 1, wherein the grinding and polishing in step 4 is that: first, by an automatic grinding and polishing machine, the all-glass substrate is subjected to a grinding and thinning process until the all-glass substrate is substantially removed, and second, the surface of the glass is polished by using a cerium oxide polishing solution until the glass substrate is exposed, and at this time, the upper surface of the embedded passive component structure mould is exposed on an upper surface of the glass substrate.

16. The wafer-level manufacturing method for embedding the passive elements in the glass substrate according to claim 1, wherein the dry-etching in step 5 is DRIE; the determination to stop the etching is that the passive component structure mould is exactly completely etched, or the passive component structure mould is completely etched and the lower all-highly-doped-silicon substrate is etched for not greater than 20 μm.

17. The wafer-level manufacturing method for embedding the passive elements in the glass substrate according to claim 1, wherein the conditions of the copper electroplating process in step 6 are that: in an acidic sulfate plating solution for the copper electroplating, the content of $CuSO_4 \cdot 5H_2O$ is 85 g/L, the content of $H_2SO_4$ is 200 g/L, the content of $Cl^-$ is 79 mg/L, and the current density is 30 $mA/cm^2$.

18. The wafer-level manufacturing method for embedding the passive elements in the glass substrate according to claim 1, wherein the conditions of the wet-etching process in step 7 are that an etching solution is a 40 wt % potassium hydroxide solution, and the etching temperature is 70° C.

19. The wafer-level manufacturing method for embedding the passive elements in the glass substrate according to claim 1, wherein in step 8, the deposited metal adhesion layer is Ti or Cr, and the electroplated metal conductive layer is Au or Cu.

\* \* \* \* \*